(12) United States Patent
Ro (10) Patent No.: US 8,044,554 B2
(45) Date of Patent: Oct. 25, 2011

(54) ULTRASONIC MOTOR AND MANUFACTURING METHOD OF THE SAME

(75) Inventor: Jong-Suk Ro, Anyang-si (KR)

(73) Assignee: Samsung Electronics Co., Ltd (KR)

( * ) Notice: Subject to any disclaimer, the term of this patent is extended or adjusted under 35 U.S.C. 154(b) by 3 days.

(21) Appl. No.: 12/824,661

(22) Filed: Jun. 28, 2010

(65) Prior Publication Data

US 2010/0327696 A1    Dec. 30, 2010

(30) Foreign Application Priority Data

Jun. 29, 2009  (KR) .................. 10-2009-0058419

(51) Int. Cl.
*H02N 2/00* (2006.01)

(52) U.S. Cl. .............. 310/323.02; 310/317; 310/323.16; 310/366

(58) Field of Classification Search .................. 310/317, 310/323.01, 323.02, 323.3, 323.08, 323.16, 310/323.17, 366

See application file for complete search history.

(56) References Cited

U.S. PATENT DOCUMENTS

| | | | | |
|---|---|---|---|---|
| 2,806,620 A | * | 9/1957 | Blanch ........................... | 215/251 |
| 5,821,667 A | * | 10/1998 | Takagi et al. ................. | 310/317 |
| 6,218,767 B1 | * | 4/2001 | Akada et al. ............. | 310/323.02 |
| 7,683,523 B2 | * | 3/2010 | Adachi ..................... | 310/323.13 |
| 7,737,604 B2 | * | 6/2010 | Adachi et al. .................. | 310/317 |
| 7,834,523 B2 | * | 11/2010 | Higashionji et al. .......... | 310/345 |
| 2006/0202589 A1 | * | 9/2006 | Kasai et al. .............. | 310/323.13 |
| 2009/0021114 A1 | * | 1/2009 | Adachi ..................... | 310/323.16 |
| 2010/0072858 A1 | * | 3/2010 | Ando et al. .............. | 310/323.16 |
| 2010/0176687 A1 | * | 7/2010 | Nagaoka .................. | 310/323.16 |
| 2010/0181870 A1 | * | 7/2010 | Nagaoka et al. .......... | 310/323.16 |
| 2010/0213792 A1 | * | 8/2010 | Sakai et al. .............. | 310/323.16 |

* cited by examiner

*Primary Examiner* — Thomas M Dougherty
(74) *Attorney, Agent, or Firm* — The Farrell Law Firm, P.C.

(57) ABSTRACT

An ultrasonic motor and a manufacturing method thereof are provided. The ultrasonic motor includes an active layered section including a piezoelectric material; an inactive section disposed below the active layered section, which has a contact portion profile as a lowest layer; a first lower layer positioned one layer below an uppermost layer of the active layered section; a second lower layer formed with separated electrodes in an upper surface thereof and positioned two layers below the uppermost layer; and a repeated structure in the active layered section having a same structure as a combination structure comprising the first lower layer and the second lower layer, the repeated structure being downwardly layered from the combination structure.

6 Claims, 6 Drawing Sheets
(1 of 6 Drawing Sheet(s) Filed in Color)

ULTRASONIC MOTOR AND MANUFACTURING METHOD OF THE SAME

PRIORITY

This application claims priority under 35 U.S.C. §119(a) to an application filed in the Korean Intellectual Property Office on Jun. 29, 2009 and assigned Serial No. 10-2009-0058419, the contents of which are incorporated herein by reference.

BACKGROUND OF THE INVENTION

1. Field of the Invention

The present invention relates to an ultrasonic motor and a manufacturing method thereof.

2. Description of the Related Art

An ultrasonic motor is a kind of small actuator that can be used for mechanical driving components within various electronic devices, such as components within a cellular phone, a digital camera, a Personal Data Assistant (PDA), a camera for a notebook, etc. Specifically, an ultrasonic motor may be used for auto focus (hereinafter, referred to as "AF"), Optical Image Stabilization (OIS), zoom, a shutter, etc.

A piezoelectric ultrasonic motor may be designed, develop, and manufactured in consideration of a variety of factors, including miniaturization, operation stability, guarantee of reliability, mass producibility, etc.

Actuators within ultrasonic motors are largely divided into two types. A first type of actuators uses electromagnetism. This first type of actuators includes motors using an electromagnetic force between a magnet and a coil, such as a voice coil motor, a step motor, etc. A second type of actuators uses a piezoelectric material. This second type of actuators uses a piezoelectric material that generates mechanical displacement through an electric field, or generates voltage by mechanical deformation. In other words, the second type of actuator drives by causing a mechanical change in the piezoelectric material through application of an electric source to the piezoelectric material, and generating a frictional force with a contact portion through application of a mechanical pressure from the outside. Such an actuator may include a Longitudinal or Bending Mode (L1B2) ultrasonic motor, a Smooth Impact Drive Mechanism (SIDM), and the like. There are also various other kinds/types of piezoelectric actuators using a cantilever, or similar elements.

However, the first type of actuator using electromagnetism has several problems because, this type uses an electromagnetic force between a magnet and a coil. Therefore, a large amount of power is consumed by the motor itself. The first type of actuator is also difficult miniaturize, has a low resolution, generates an electromagnetic field, and has no holding torque for maintaining a position when the actuator is stopped. Thus, for the motor and a controller, continuous driving and power consumption are required to maintain a lens position when the actuator is used for AF of a camera of a mobile terminal, or other similar functions. This may be a significant disadvantage in a mobile device. Also, there is a problem of reproducibility. Specifically, a change in a load amount is caused by gravity when the direction of a mobile terminal is turned, which causes a problem of the reproducibility of the motor.

By contrast, the second type of actuators using a piezoelectric material is superior to the first type of actuator using electromagnetism in regards to power consumption, size, resolution, generation of an electromagnetic field, etc. However improvements in regards to miniaturization, reliability, stability, mass producibility, a price, etc. are still desired, even for the second type of actuators.

Figure 1:
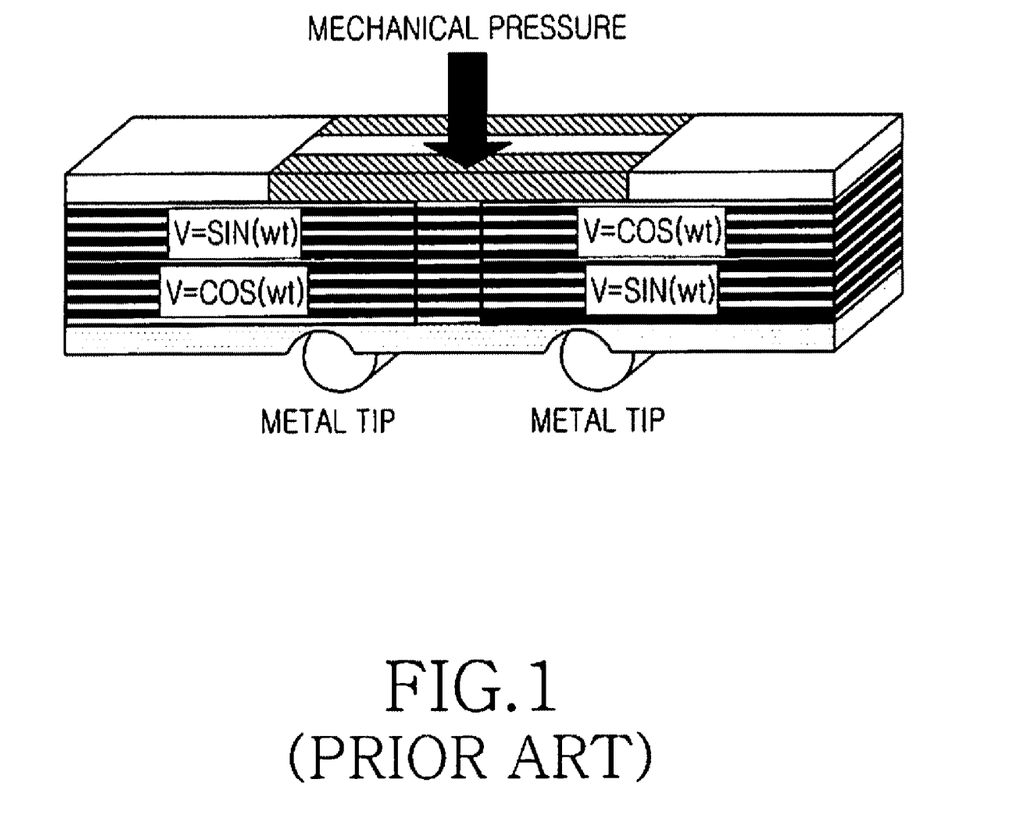
FIG. 1 is a diagram illustrating an external structure of a conventional L1B2 mode ultrasonic motor.

FIG. 1 is a view showing the external structure of a conventional L1B2 mode ultrasonic motor.

A conventional L1B2 mode ultrasonic motor requires, at a lower end thereof, a groove and an inactive section for seating a contact tip, and further requires, at an upper end thereof, another inactive section with the same thickness as that the thickness of the inactive section at the lower end to minimize L1 B2 mode distortion. This causes an increase in the entire thickness of the motor, thereby hindering miniaturization of the motor. The inactive sections at the upper/lower ends also reduce displacement, thereby reducing the performance of the motor. In other words, the inactive section at the lower end is necessary to stably seat a contact material, and also the inactive section at the upper end, which is symmetrical to that at the lower end, is necessary to avoid mode distortion. These inactive sections at the upper/lower ends cause an unfavorable effect on the miniaturization and the performance.

SUMMARY OF THE INVENTION

Accordingly, the present invention has been made to solve the above-mentioned problems occurring in the prior art, and the present invention provides an ultrasonic motor addressing problems including the above-described problems of a conventional actuator using an electromagnetism or a piezoelectric material. The present invention also provides an ultrasonic motor that allows an inactive section to be used only in the lower layer, and an ultrasonic motor that does not additionally require contact medium processing and bonding.

In accordance with an aspect of the present invention, there is provided an L1B2 mode ultrasonic motor including an active layered section including a piezoelectric material; an inactive section disposed below the active layered section, which has a contact portion profile as a lowest layer; three external electrodes are disposed parallel to each other with a predetermined interval in an uppermost layer of the active layered section; three lateral surface electrodes disposed parallel to each other in a vertical direction at an outer lateral surface of each piezoelectric layer of the active layered section, the outer lateral surface electrodes being connected to electrodes in an upper layer of the active layered section so as to receive transmission of electric sources; a first lower layer positioned one layer below an uppermost layer of the active layered section, wherein the first lower layer includes an electrode on an upper surface thereof and is grounded by a connection to an electrode at a lateral surface of the active layered section; a second lower layer formed with separated electrodes in an upper surface thereof and positioned two layers below the uppermost layer, wherein the each of the respective separated electrodes is applied with an electric source having a predetermined phase difference, wherein the respective separated electrodes are connected to different electrodes on at least one lateral surface, and wherein polarizing directions of the first lower layer and the second lower layer from the uppermost layer are opposed to each other; and a repeated structure in the active layered section having a same structure as a combination structure comprising the first lower layer and the second lower layer, the repeated structure being downwardly layered from the combination structure.

In accordance with another aspect of the present invention, there is provided a method for manufacturing an ultrasonic motor, the method including bonding an inactive section including a metallic material to a layered-type piezoelectric ceramic board; and dicing the combination of the inactive section bonded to the layered-type piezoelectric ceramic board.

In accordance with a further aspect of the present invention, there is provided a method for manufacturing an ultrasonic motor, the method including bonding an inactive section made of a ceramic material to a layered-type piezoelectric ceramic board as soon as the layered-type piezoelectric ceramic board is sintered; and dicing the combination of inactive section bonded to the layered-type piezoelectric ceramic board.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The above and other features, aspects, and advantages of the present invention will be more apparent from the following detailed description taken in conjunction with the accompanying drawings, in which.

DETAILED DESCRIPTION OF EMBODIMENTS OF THE INVENTION

Hereinafter, embodiments of the present invention are described in detail with reference to the accompanying drawings. In the accompanying drawings, the same reference numerals denote the same or corresponding elements even in different figures. In the following description, numerous specific details on configuration elements of a specific circuit are set forth in order to provide a thorough understanding of the present invention. It will be apparent, however, to one skilled in the art that the present invention may be practiced without these specific details. In the following description of the present invention, a detailed description of known functions and configurations incorporated herein is omitted to avoid making the subject matter of the present invention unclear.

Figure 2A:
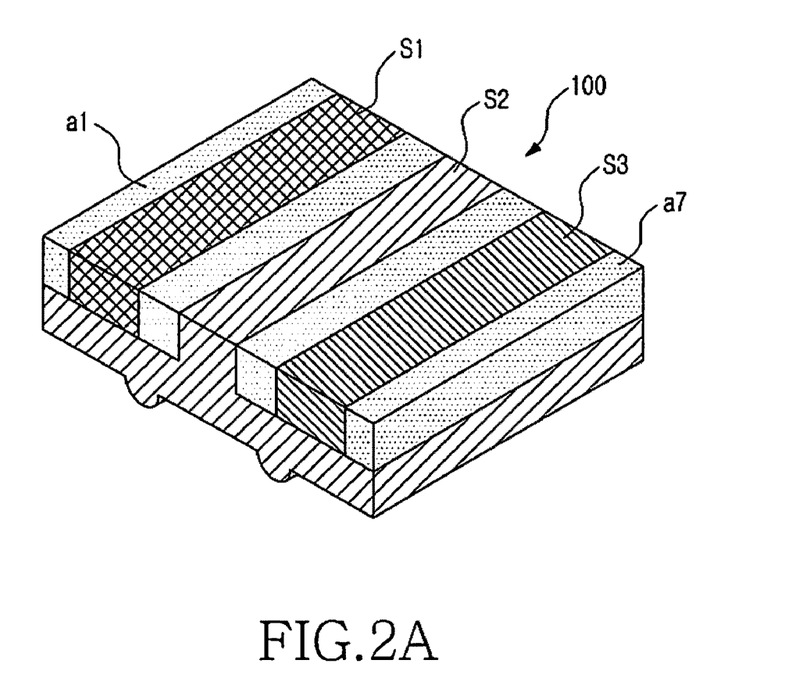
FIG. 2A is a diagram illustrating a perspective view of an external structure of an ultrasonic motor according to an embodiment of the present invention.
Figure 2B:
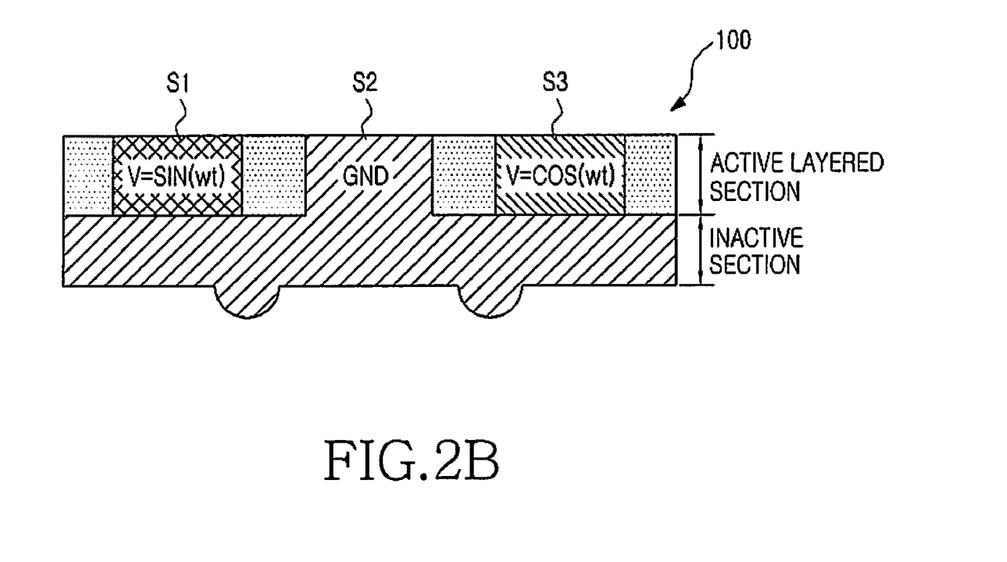
FIG. 2B is a diagram illustrating a side plan view of the external structure of the ultrasonic motor illustrated in FIG. 2A.

FIGS. 2A and 2B are diagrams illustrating a perspective view and a side plan view, respectively, of an external structure of an ultrasonic motor according to an embodiment of the present invention.

Referring to FIG. 2, the illustrated ultrasonic motor has a polarizing direction of a piezoelectric ceramic and an arrangement of electrode patterns, which allows an inactive section to be employed only in the lower layer. Specifically, the ultrasonic motor includes a layered section made of a piezoelectric material to generate an L1B2 mode, and an inactive section playing a role of a contact medium.

The ultrasonic motor according to an embodiment of the present invention does not require additional machining on the contact medium because the inactive section can perform as a contact portion with a rotor without a bonding process.

Herein, electric sources S1, S2, and S3 may be sin (wt), grounding (GND), and cos (wt), respectively.

In contrast to the above-described conventional ultrasonic motor illustrated in FIG. 1, the ultrasonic motor according to an embodiment of the present invention does not generate the distortion of an L1 B2 mode, since only the inactive section performs as a contact tip, at the lower end, due to characteristic L1B2 generating principle/structure of the conventional ultrasonic motor. In other words, at the lower end, the inactive section is required to perform as a contact medium. Meanwhile at the upper end, another inactive section having the same thickness as a thickness at the lower end is not required in an ultrasonic motor according to an embodiment of the present invention, in contrast to conventional ultrasonic motors. The inactive section at the lower end performs as a contact medium, and additionally contributes to effectively generating a bending mode and improving performance. Ultrasonic motors according to an embodiment of the present invention, due to the unnecessity of the inactive section in the upper layer, can be thinner and miniaturized more easily than conventional ultrasonic motors. In addition, ultrasonic motors according to an embodiment of the present invention can achieve the same level of performance as conventional ultrasonic motors, while having fewer layers within the same thickness of a comparable conventional ultrasonic motor. For example, while a conventional ultrasonic motor may have 20 active layers, a comparable ultrasonic motor according to an embodiment of the present invention can achieve the same level of performance with only 14 active layers. Accordingly, since the number of layers is proportional to material costs, the production unit cost of an ultrasonic motor according to an embodiment of the present invention may be less than that of a conventional ultrasonic motor.

Figure 3:
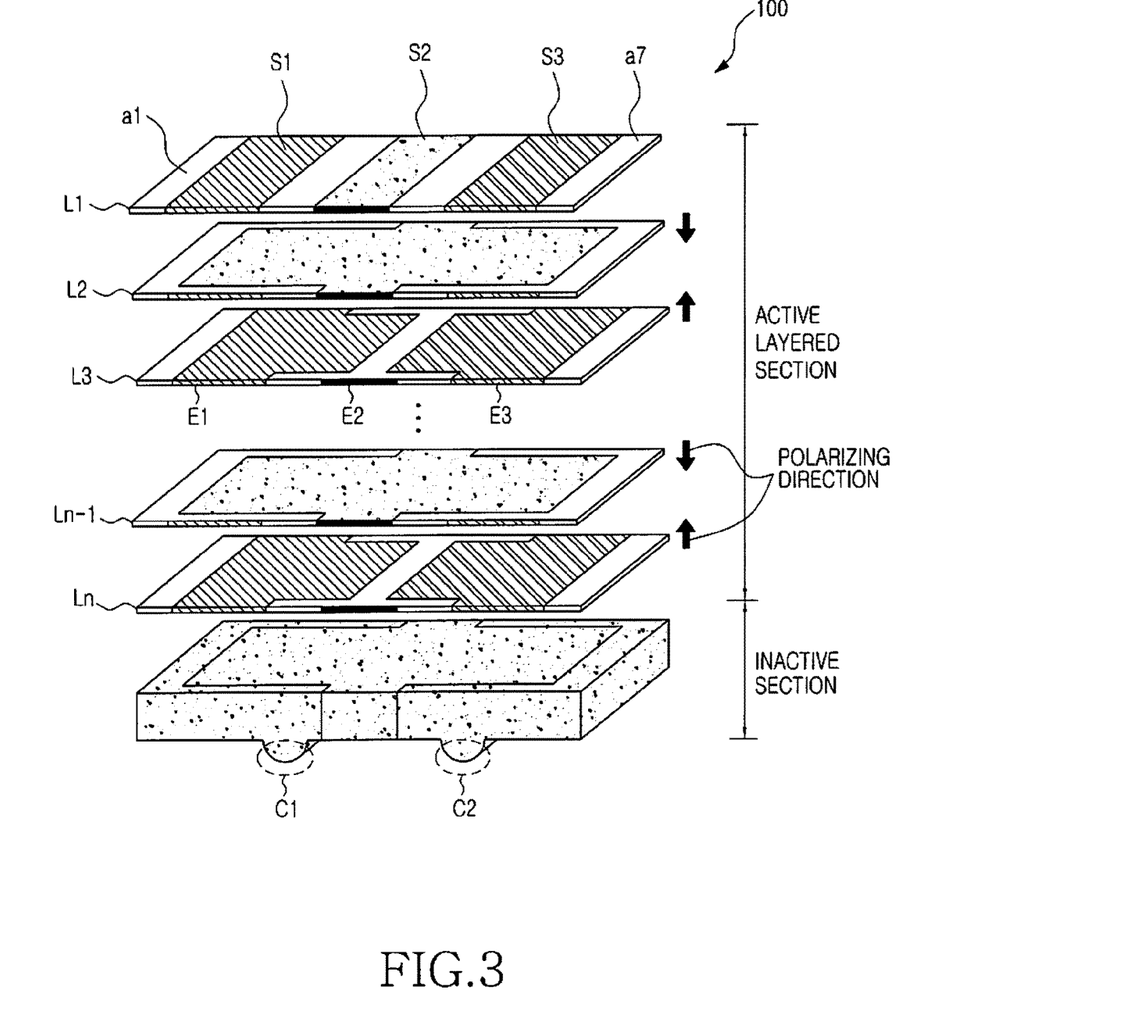
FIG. 3 is a diagram illustrating a detailed structure of an ultrasonic motor according to an embodiment of the present invention.

FIG. 3 is a diagram illustrating a detailed structure of an ultrasonic motor according to an embodiment of the present invention.

Referring to FIG. 3, layers L1 to Ln denote piezoelectric layers constituting an active layered section. In the uppermost layer L1, electric sources S1, S2, and S3 as external sources may be sin (wt), grounding (GND), and sin (wt+θ), respectively. The polarizing direction of L2 and the polarizing direction of L3 are opposite to each other. Herein, when L2 and L3 are referred to as a "couple", such a couple of layers may be repeatedly layered an even number of times to form an active layered section. An electric source is not connected to an inactive section in the lowest layer.

The L1B2 mode ultrasonic motor of FIG. 3 includes an active layered section and an inactive section. The inactive section is disposed below the layered section, and has contact portion profiles C1 and C2 in the lowest layer. The lowest layer may be made of a metallic material or a ceramic material. The active layered section may be made of a piezoelectric material. The configuration of the active layered section is described in more detail as follows.

In the uppermost layer (the first layer) L1, three external electrodes S1 to S3 are disposed parallel to each other at a predetermined interval. At the outer lateral surface of each piezoelectric layer, three electrodes E1 to E3 are disposed parallel to each other in a vertical direction and are connected to electrodes in the upper layer so as to transmit electric sources. One electrode on the upper surface of the first layer below the uppermost layer (in this case, the second layer L2) is grounded by being connected to the electrode at the lateral surface. The upper surface of the second layer below the uppermost layer (in this case, the third layer L3) is formed with separated electrodes, and each of the electrodes is applied with an electric source having a predetermined phase difference. Respective separated electrodes are connected to different electrodes on at least one lateral surface. For example, the separated electrodes on the upper surface of the second lower layer L3 from the uppermost layer may halve the upper surface, and the electric source applied to each of the electrodes may have a phase difference of 90°. The polarizing directions of layers L2 and L3 are opposed to each other. The same structure as that of layers L2 and L3 is repeated and is downwardly layered.

Figure 4:
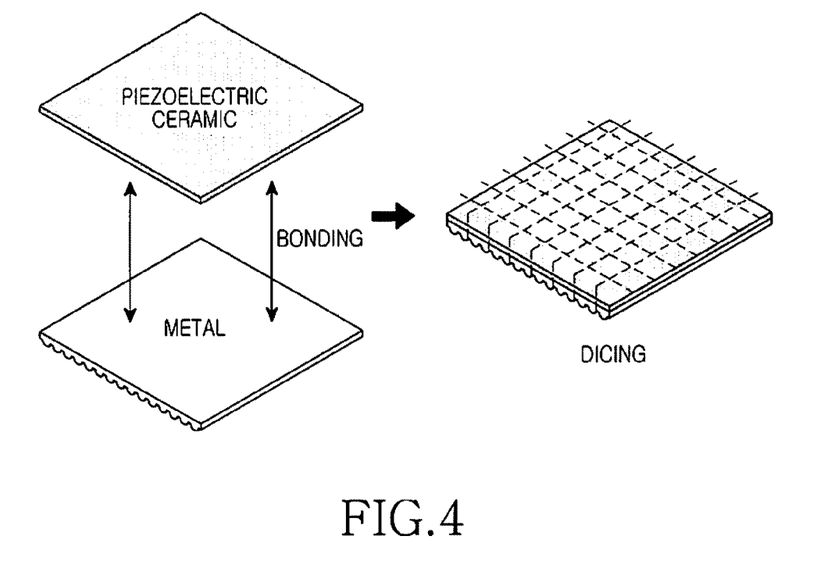
FIG. 4 is a diagram illustrating a method of manufacturing an ultrasonic motor according to an embodiment of the present invention in a case where an inactive section is made of a metallic material.
Figure 5:
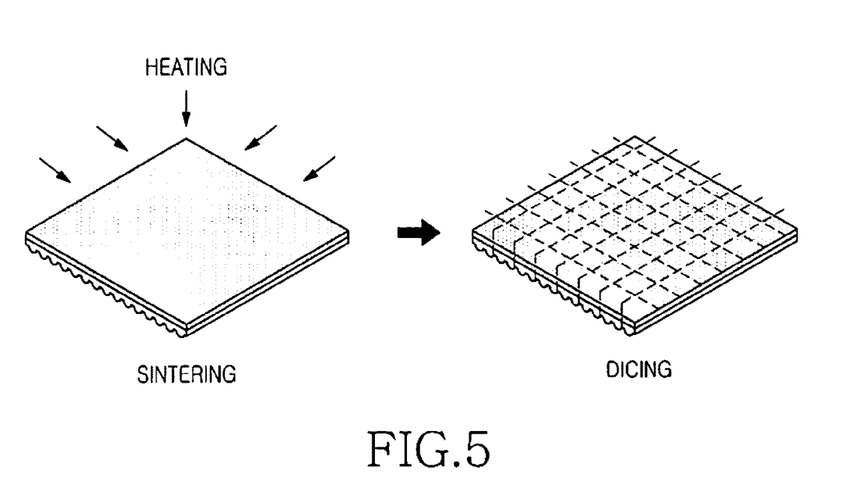
FIG. 5 is a diagram illustrating a method of manufacturing an ultrasonic motor according to an embodiment of the present invention in a case where an inactive section is made of a ceramic material.

FIGS. 4 and 5 are diagrams illustrating methods of manufacturing an ultrasonic motor according to an embodiment of the present invention. More specifically, FIG. 4 illustrates one case where an inactive section is made of a metallic material, and FIG. 5 illustrates another case where the inactive section is made of a ceramic material.

Referring to FIG. 4, in manufacturing a piece actuator as illustrated in either FIG. 2 or FIG. 3, in a case where the lowest layer, that is, the inactive section, is made of a metallic material, a metallic inactive section manufactured by press or forging is bonded to a layered-type piezoelectric ceramic board, and both the inactive section and the piezoelectric ceramic board, which are bonded to each other, are diced. This method may increase the yield of the piece, is advantageous with respect to a process and a cost for manufacturing an ultrasonic motor. Examples of the metallic material which may be used for the inactive section may include phosphor bronze, Steel Use Stainless (SUS), aluminum, nickel, etc.

Referring to FIG. 5, in a case where the inactive section is made of a ceramic material, an inactive section is bonded to a layered-type piezoelectric ceramic board as soon as the piezoelectric ceramic board is sintered, and then both the inactive section and the layered-type piezoelectric ceramic board, which are bonded to each other, are diced. This method may also increase the yield of the piece, and is advantageous with respect to a process and a cost for manufacturing an ultrasonic motor. Examples of the ceramic material which may be used for the inactive section may include piezoelectric ceramic, alumina, zirconia, silicon, etc.

A piezoelectric effect is a mutual conversion of electric energy and mechanical energy. In general, both a direct piezoelectric effect and an inverse piezoelectric effect are referred to as a piezoelectric effect. This effect may be generated from materials such as potassium sodium tartrate, barium titanate, etc, which have a high piezoelectric effect. The direct piezoelectric effect (or a primary piezoelectric effect) generates an electric field by the application of mechanical deformation. The inverse piezoelectric effect (or a secondary piezoelectric effect) causes mechanical deformation by the application of an electric field.

A piezoelectric motor includes an actuator using an inverse piezoelectric effect of a piezoelectric material. A piezoelectric motor has its own characteristics and advantages, since its driving source, and operation principle are different from those of an electromagnetic motor.

A piezoelectric actuator according to an embodiment of the present invention is preferably applied to an ultrasonic motor operating with a mechanical vibration of at least 20 KHz, which is beyond than a human's audible frequency band, from among various types of piezoelectric actuators.

Figure 6:
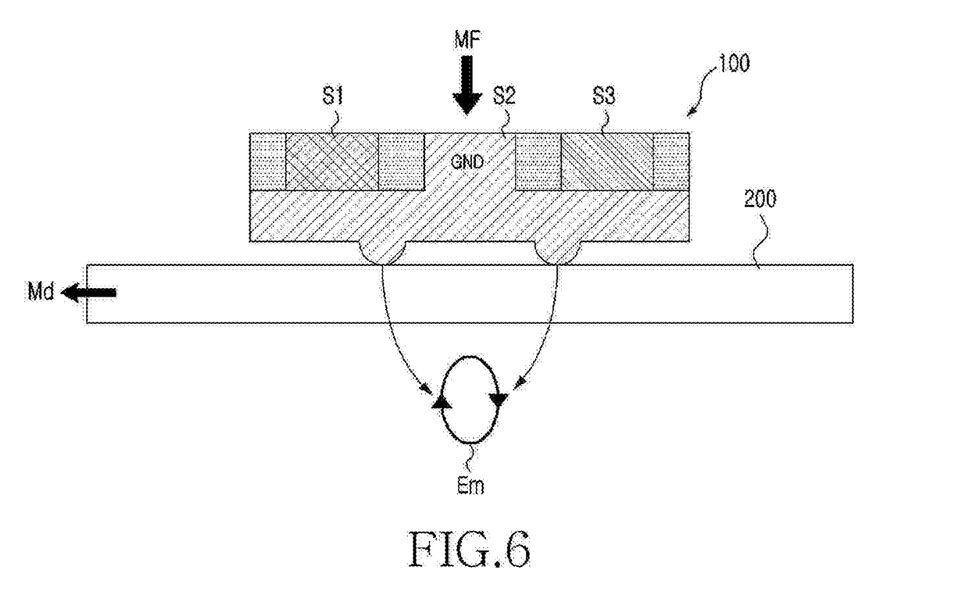
FIG. 6 is a diagram illustrating a basic operating principle of an ultrasonic motor according to an embodiment of the present invention.

FIG. 6 is a diagram illustrating a basic operating principle of an ultrasonic motor according to an embodiment of the present invention.

Referring to FIG. 6, an ultrasonic motor including a piezoelectric actuator according to an embodiment of the present invention causes mechanical deformation in a vibrator 100 made of a piezoelectric ceramic by application of electric sources S1 to S3 to the vibrator 100, and thereby generates an elliptical motion (Em) at the contact portion of the vibrator 100 and a rotor 200. At the same time, through the application of an external Mechanical Force (MF), the ultrasonic motor drives by generating a frictional force between the vibrator 100 and the rotor 200. Herein, the electric sources S1, S2, and S3 may be sin (wt), grounding (GND), and sin (wt+θ), respectively.

L1B2 is one of various vibration modes that can generate such a vibrating elliptical motion. Herein, L denotes a length direction mode of a piezoelectric vibrator, that is, a longitudinal mode. B denotes a bending mode. Also, in the term "L1B2" for example, numbers denote the order of a vibration mode.

The elliptical motion is generated by overlapping an L mode and a B mode of the vibrator. In order to generate a required vibration mode, a resonant frequency ruled by a shape is applied, as an electric source, to the vibrator.

Figure 7A:
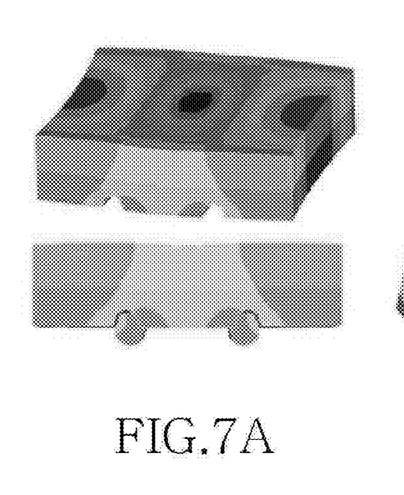
FIG. 7A is a diagram illustrating shapes of an L1 mode in an ultrasonic motor according to an embodiment of the present invention.
Figure 7B:
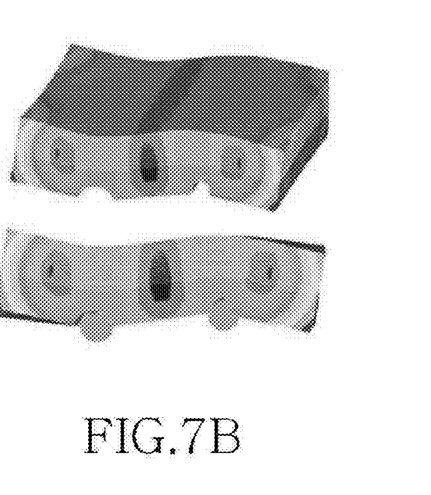
FIG. 7B is a diagram illustrating shapes of a B2 mode in the ultrasonic motor illustrated in FIG. 7A.

FIGS. 7A and 7B are diagrams illustrating shapes of an L1 mode and a B2 mode, respectively, in an ultrasonic motor according to an embodiment of the present invention.

Figure 8:
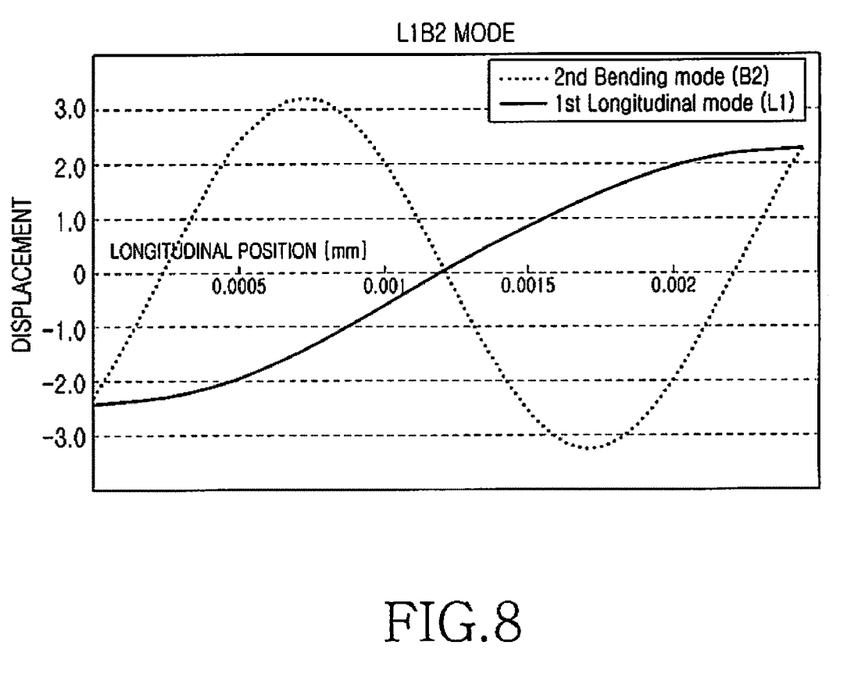
FIG. 8 is a diagram illustrating L1B2 mode graphs of an ultrasonic motor according to an embodiment of the present invention.

FIG. 8 is a diagram illustrating L1B2 mode graphs of an ultrasonic motor according to an embodiment of the present invention. The graphs of FIG. 8 include a displacement according to longitudinal positions in a first longitudinal mode (L1) and a second bending mode (B2).

Although the present invention has been described with respect to specific embodiments thereof, various changes and modifications can be carried out by those skilled in the art without departing from the scope of the invention as defined by the claims. Therefore, the scope of the invention is not limited to the disclosed embodiments, and is defined by the following claims and their full scope of equivalents.

As described above, embodiments of the present invention, may be used to solve various problems resulting from us of conventional actuators using electromagnetism, such problems including high power consumption, difficulty in miniaturization, low resolution, generation of an electromagnetic field, impossibility of the maintaining of a position the actuator stops operating, reproducibility according to a position difference, etc. The volume of an actuator may also be reduced according to embodiments of the present invention, due to the use of an inactive section only in the lower layer, piezoelectric ceramic using the inactive section as a contact portion, and the arrangement of electrode patterns, and the manufacturing cost can be reduced by reducing manufacturing processes and components. An actuator piece according to embodiments of the present invention has excellent reliability and stability characteristics, and a manufacturing process thereof is simpler that a manufacturing process of a conventional actuator piece, thereby increasing the yield and reducing the manufacturing cost. According to embodiments of the present invention, a stable 2-point contact linear motion is also used to increase reliability and stability.

While the present invention has been shown and described with reference to certain embodiments thereof, it will be understood by those skilled in the art that various changes in form and details may be made therein without departing from the spirit and scope of the invention as defined by the appended claims.

What is claimed is:

1. An ultrasonic motor employing an L1B2 mode, comprising:

an active layered section including a piezoelectric material;

an inactive section disposed below the active layered section, which has a contact portion profile as a lowest layer;

three external electrodes disposed parallel to each other with a predetermined interval in an uppermost layer of the active layered section;

three lateral surface electrodes disposed parallel to each other in a vertical direction at an outer lateral surface of each piezoelectric layer of the active layered section, the outer lateral surface electrodes being connected to electrodes in an upper layer of the active layered section so as to receive transmission of electric sources;

a first lower layer positioned one layer below an uppermost layer of the active layered section, wherein the first lower layer includes an electrode on an upper surface thereof and is grounded by a connection to an electrode at a lateral surface of the active layered section;

a second lower layer formed with separated electrodes in an upper surface thereof and positioned two layers below the uppermost layer, wherein the each of the respective separated electrodes is applied with an electric source having a predetermined phase difference, wherein the respective separated electrodes are connected to different electrodes on at least one lateral surface, and wherein polarizing directions of the first lower layer and the second lower layer from the uppermost layer are opposed to each other; and a repeated structure in the active layered section having a same structure as a combination structure comprising the first lower layer and the second lower layer, the repeated structure being downwardly layered from the combination structure.

2. The ultrasonic motor as claimed in claim 1, wherein the piezoelectric material is a piezoelectric ceramic.

3. The ultrasonic motor as claimed in claim 1, wherein the inactive section is not connected to an electric source.

4. The ultrasonic motor as claimed in claim 1, wherein the separated electrodes on the upper surface of the second lower layer halve the upper surface, and the electric sources applied to each respective separated electrodes have a phase difference of 90°.

5. The ultrasonic motor as claimed in claim 1, wherein the repeated structure is downwardly and repeatedly layered from the combination structure an odd number of times.

6. The ultrasonic motor as claimed in claim 1, wherein the lowest layer includes a metallic material or a ceramic material.

* * * * *